(12) United States Patent
Asano et al.

(10) Patent No.: US 6,818,969 B2
(45) Date of Patent: Nov. 16, 2004

(54) SEMICONDUCTOR DEVICE

(75) Inventors: Tetsuro Asano, Oizumi-machi (JP);
Mikito Sakakibara, Menuma-machi (JP); Hideyuki Inotsume, Oizumi-machi (JP); Haruhiko Sakai, Ota (JP); Shigeo Kimura, Nitta-machi (JP)

(73) Assignee: Sanyo Electric Co., Ltd., Osaka (JP)

( * ) Notice: Subject to any disclaimer, the term of this patent is extended or adjusted under 35 U.S.C. 154(b) by 83 days.

(21) Appl. No.: 10/283,365

(22) Filed: Oct. 30, 2002

(65) Prior Publication Data

US 2003/0094679 A1 May 22, 2003

(30) Foreign Application Priority Data

Nov. 1, 2001 (JP) .......................................... 2001-336746
Oct. 4, 2002 (JP) .......................................... 2002-292013

(51) Int. Cl.$^7$ ........................ H01L 23/495; H01L 23/12
(52) U.S. Cl. ........................................ 257/666; 257/723
(58) Field of Search ................................ 257/666–677, 257/723–724

(56) References Cited

U.S. PATENT DOCUMENTS 5,949,139 A * 9/1999 Imura et al. ................. 257/723
6,639,305 B2 * 10/2003 Carter et al. ................. 257/666

* cited by examiner

Primary Examiner—Cuong Nguyen
(74) Attorney, Agent, or Firm—Morrison & Foerster LLP

(57) ABSTRACT

A semiconductor device includes four input terminals, four leads extending from the corresponding input terminals and a semiconductor chip that has a first circuit and a second circuit and is mounted on one of the leads. The lead having the semiconductor chip thereon bends in a plane of the substrate so that an end portion and a mid portion of the lead are exposed on one side of the semiconductor chip. One of the input electrode pads of the first circuit is connected to the end portion of the lead by a bonding wire. The end portion of the lead is on the opposite side of the mid portion of the lead with respect to one of the leads that is connected to one of the input electrode pads of the second circuit by a bonding wire. This configuration achieves a crossing wiring structure within the packaging. By changing the connection of bonding wires, the crossing wiring structure is easily undone.

16 Claims, 11 Drawing Sheets

SEMICONDUCTOR DEVICE

BACKGROUND OF THE INVENTION

1. Field of the Invention

This invention relates to a semiconductor device and its packaging, specifically to a packaging of semiconductor device that accommodates variable requirements of a user of the semiconductor device.

2. Description of the Related Art

Switching elements for high frequency signals have been a focus of development in many application areas including mobile communication equipment that utilizes microwaves in GHz frequency range and alternates antennas and reception/transmission signals. Such a device is described, for example, in a Japanese Laid Open Patent Publication, No. Hei 9-181642. This type of device often includes a field effect transistor (FET) functioning as a high frequency switch, which is made of gallium arsenide (GaAs), and is integrated as a monolithic microwave integrated circuit (MMIC) having the high frequency switches.

An MMIC device with two GaAs switches, as a result of the most recent development is described in a commonly owned copneding U.S. patent application Ser. No. 10/016,143, entitled "Compound Semiconductor Switching Device." The disclosure of U.S. patent application Ser. No. 10/016,143 is, in its entirety, incorporated herein by reference. FIG. 1 is a plan view of a packaging structure of the device described in this U.S. Patent application. A chip 119 has two GaAs FET switches (not shown). One of the two switches has two input electrode pads 235a, 235b, an output electrode pad 235g and a control electrode pad 235h, another of the two switches has two input electrode pads 235c, 235d, an output electrode pad 235f and a control electrode pad 235e. Each of the control electrode pads 235e, 235h is shared by the two switches. Each of the eight electrode pads is connected to a corresponding terminal 135a–135h, which is disposed adjacent the electrode pad on an insulating substrate 122, by a bonding wire 137. The chip 119 is mounted on a base 125 that is a part of a lead pattern 127 including the terminals 135a–135h.

One of the applications of this two-switch device is to alternate two sets of complementary signals. For example, a mobile telephone needs to alternate between a CDMA (Code Division Multiple Access) signal and a GPS (Global Positioning System) signal. The connection scheme of this application is shown in FIG. 2. One of a set of CDMA balanced signals is applied to the input electrode Ia1, and another to the input electrode Ib1. One of a set of GPS balanced signals is applied to the input electrode Ia2, and another is to Ib2. In this configuration, depending on a control signal applied to each of the control electrode pads C1, C2 of the two switches, the balanced CDMA signal or the balanced GPS signal is selected and outputted to the two output electrode pads Oa, Ob.

However, a user of this two-switch device has to provide a wiring configuration that allows an intersection of one of the CDMA balanced signals and one of the GPS balanced signals. Since these are signals in an RF range, such an intersecting wiring needs to be carefully designed to avoid mutual interference by the user and requires additional space to accommodate the intersection.

SUMMARY OF THE INVENTION

The invention provides an insulating substrate for mounting a surface mounting element thereon. The substrate includes a first terminal disposed on the substrate, a first lead disposed on the substrate and extending from the first terminal, a second terminal disposed on the substrate, and a second lead disposed on the substrate and extending from the second terminal. The substrate also includes an element mounting area for mounting the surface mounting element thereon. The first and second terminals are disposed on the same side of the substrate with respect to the element mounting area, and the first lead comes in and comes out of the element mounting area so that a portion of the first lead coming out of the element mounting area is located on the opposite side of a portion of the first lead coming in the element mounting area with respect to the second lead.

The invention also provides a packaging of a surface mounting element that includes an insulating substrate, a first terminal disposed on the substrate, and a first lead disposed on the substrate and extending from the first terminal. The surface mounting element is mounted on a portion of the first lead. The packaging also includes a second terminal disposed on the substrate and a second lead disposed on the substrate and extending from the second terminal. The first and second terminals are disposed on the same side of the substrate with respect to the surface mounting element, and the first lead comes in and comes out of an area covered by the surface mounting element so that a portion of the first lead coming out of the area is located on the opposite side of a portion of the first lead coming in the area with respect to the second lead.

The invention further provides a conducting lead pattern for mounting a surface mounting element thereon. The lead pattern includes a first terminal portion, a first lead portion extending from the first terminal portion, a second terminal portion, and a second lead portion extending from the second terminal portion. The lead pattern also includes an element mounting portion for mounting the surface mounting element thereon, which is a part of the first lead portion. The first and second terminal portions are disposed on the same side of the substrate with respect to the element mounting portion, and a part of the first lead portion connected to the element mounting portion at one end of the element mounting portion is located on an opposite side of another part of the first lead portion connected to the element mounting portion at another end of the element mounting portion with respect to the second lead portion.

The invention also provides a packaging of a surface mounting element that includes a resin body. The packaging includes a first terminal embedded in the resin body and a first lead embedded in the resin body and extending from the first terminal. The surface mounting element is mounted on a portion of the first lead. The packaging also includes a second terminal embedded in the resin body and a second lead embedded in the resin body and extending from the second terminal. The first and second terminals are disposed on the same side of the resin body with respect to the surface mounting element, and the first lead comes in and comes out of an area covered by the surface mounting element so that a portion of the first lead coming out of the area is located on an opposite side of a portion of the first lead coming in the area with respect to the second lead.

The invention further provides a semiconductor device including an insulating substrate, a plurality of terminals disposed on the substrate, a plurality of leads disposed on the substrate and extending from the corresponding terminals, and a semiconductor chip having a plurality of electrode pads disposed on a surface thereof and being mounted on one of the leads. The lead having the semiconductor chip thereon bends in a plane of the substrate so that an end portion and a mid portion of the lead having the semiconductor chip thereon are outside an area covered by the semiconductor chip, and one of the electrode pads of the semiconductor chip is connected to the end portion of the lead having the semiconductor chip thereon by a bonding wire.

The invention also provides a semiconductor device including an insulating substrate, four input terminals disposed on the substrate and aligning along one edge of the substrate, and four leads disposed on the substrate. Each of the leads extends from one of the input terminals. The device also includes a semiconductor chip having a first circuit and a second circuit and being mounted on one of the leads. Each of the first and second circuits has two input electrode pads. The lead having the semiconductor chip thereon bends in a plane of the substrate so that an end portion and a mid portion of the lead having the semiconductor chip thereon are outside an area covered by the semiconductor chip, one of the input electrode pads of the first circuit is connected to the end portion of the lead having the semiconductor chip thereon by a bonding wire, and the end portion of the lead having the semiconductor chip thereon is on the opposite side of the mid portion of the lead having the semiconductor chip thereon with respect to one of the leads that is connected to one of the input electrode pads of the second circuit by a bonding wire.

The invention further provides a semiconductor device including a resin body, a plurality of terminals embedded in the resin body, a plurality of leads embedded in the resin body and extending from the corresponding terminals, and a semiconductor chip having a plurality of electrode pads disposed on a surface thereof and being mounted on one of the leads. The lead having the semiconductor chip thereon bends in a plane of the substrate so that an end portion and a mid portion of the lead having the semiconductor chip thereon are outside an area covered by the semiconductor chip, and one of the electrode pads of the semiconductor chip is connected to the end portion of the lead having the semiconductor chip thereon by a bonding wire.

The invention also provides a semiconductor device including a resin body, four input terminals embedded in the resin body and aligning along one edge of the resin body, and four leads embedded in the resin body. Each of the leads extends from one of the input terminals. The device also includes a semiconductor chip having a first circuit and a second circuit and being mounted on one of the leads. Each of the first and second circuits has two input electrode pads. The lead having the semiconductor chip thereon bends in a plane of the substrate so that an end portion and a mid portion of the lead having the semiconductor chip thereon are outside an area covered by the semiconductor chip, one of the input electrode pads of the first circuit is connected to the end portion of the lead having the semiconductor chip thereon by a bonding wire, and the end portion of the lead having the semiconductor chip thereon is on the opposite side of the mid portion of the lead having the semiconductor chip thereon with respect to one of the leads that is connected to one of the input electrode pads of the second circuit by a bonding wire.

DETAILED DESCRIPTION OF THE INVENTION

Figure 3A:
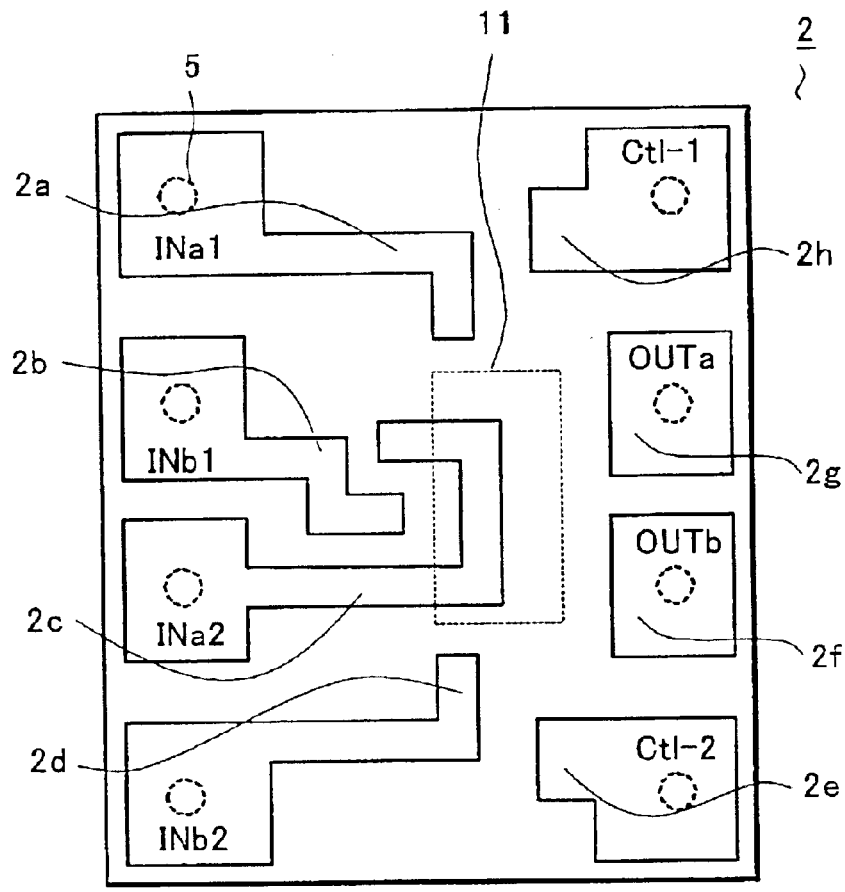
FIG. 3A is a plan view of a lead pattern for one chip of a semiconductor device of a first embodiment of this invention.

A semiconductor device with a packaging structure of a first embodiment of this invention is described with reference to FIGS. 3A–7B. FIG. 3A is a plan view of a lead pattern 2 for one chip of the first embodiment. The lead pattern 2 is disposed on an insulating substrate 1, and has four inputs terminals INa1, INb1, INa2, INb2, two control terminals Ctl-1, Ctl-2 and two output terminals OUTa, OUTb for two FET switches of a compound semiconductor device that is mounted on this lead pattern. All four input terminals have corresponding leads 2a, 2b, 2c, 2d extending from the respective terminals. A terminal is an area of the lead pattern that is used for an external connection, and a lead is a portion of the lead pattern that is used for connection with electrode pads on the chip to be mounted thereon. In this configuration, the terminals are connected to external signal sources via external electrodes that are formed underneath the terminals on the bottom side of the substrate, as later described with reference to FIG. 7A.

Figure 1:
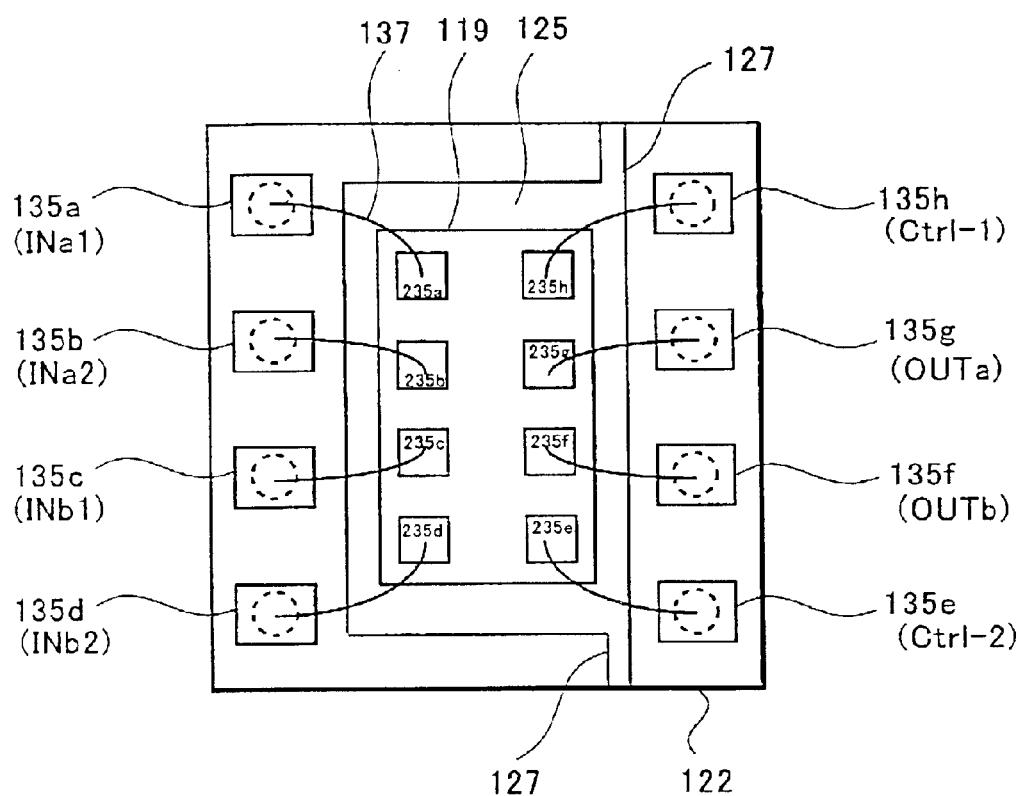
FIG. 1 is a plan view of a two-switch chip with four input electrode pads mounted on a substrate with four input terminals.

An area 11 of the substrate 1, which is located in the central portion of the substrate 1, is an mounting area for mounting the chip. One of the four leads extending from the input terminals, 2c, is bent in a plane of the substrate 1 so that the lead 2c comes in the mounting area 11 and comes out of the mounting area 11 on the same side of the element mounting area 11. The portion of the lead 2c coming out of the mounting area 11 is located on the opposite side of the portion of the lead 2c coming in the mounting area 11 with respect to another lead 2b that extends from the terminal INb1. The chip is mounted on the portion of the lead 2c, which is inside the mounting area 11. In other words, this lead replaces the base 125 of the lead pattern of FIG. 1. As long as the end portion of lead 2c is exposed outside the mounting area 11 and has enough space for connection to a corresponding electrode pad on the chip, the relative positioning of the lead 2c and the mounting area 11 with respect to the substrate 1 is not limited to the configuration of FIG. 3A. If necessary, this end portion further extends to come back in the mounting area 11, provided that the lead 2c is exposed enough for connection to the electrode pad besides the portion of the lead 2c that extends from the terminal INa2 and reaches the mounting area 11.

Figure 3B:
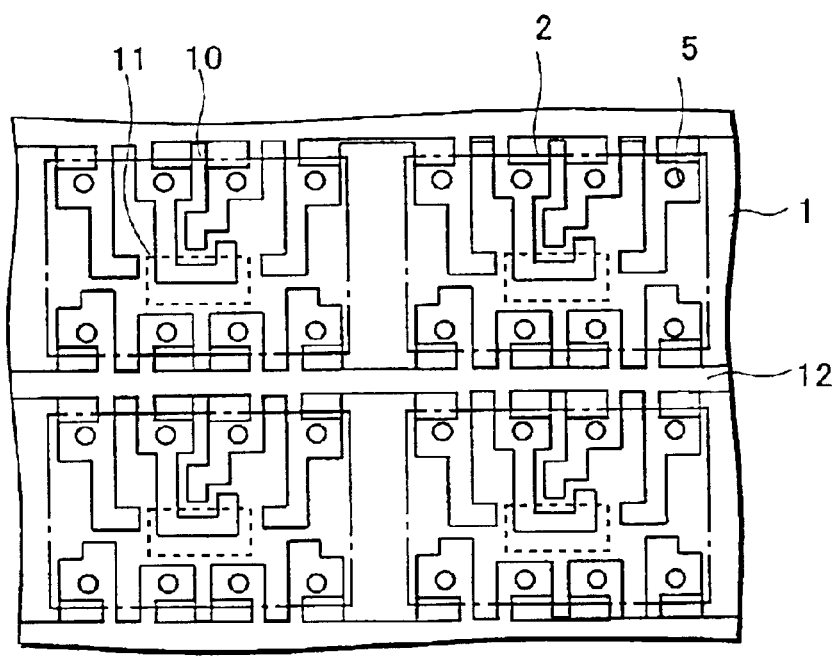
FIG. 3B is a plan view of a lead pattern for a plurality of the chips.

FIG. 3B is a plan view of a lead pattern for a plurality of the compound semiconductor chips. Each of package areas 10 of the lead pattern 2 contains the same lead pattern as that of FIG. 3A. The package areas 10 are interconnected by a connecting portion 12. In this embodiment, the package area 10 is about 1.9 mm×1.6 mm, and the mounting area 11 is about 0.62 mm×0.31 mm, although the size of the mounting area 11 should be adjusted according to the size of a chip mounted thereon. The separation between the package areas 10 are about 100 μm in both longitudinal and the transverse directions. This separation is required for dicing the substrate 1 to separate individual completed packaging. The connecting portion 12 is required to form the lead pattern 2 using gold plating. When electroless plating is used for forming the lead pattern 2, the connecting portion is not required and the package areas 10 are formed to be separated from each other.

Figure 4:
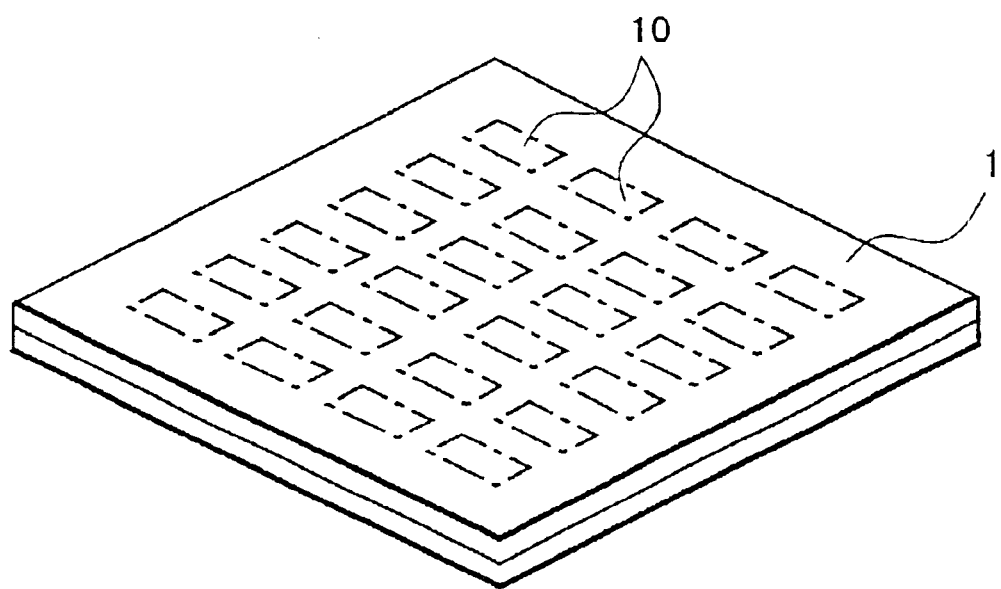
FIG. 4 is a perspective view of a substrate of the first embodiment.

FIG. 4 is a perspective view of the insulating substrate 1 used in the first embodiment. The substrate 1 is large enough to provide more than one hundred package areas 10. The substrate 1 can be one plate or a stack of a plurality of plates, which are mad of ceramic materials, glass epoxies or the like. The total thickness of the substrate 1 is 180 to 250 μm so that the substrate can withstand mechanical stresses it receives during manufacturing processes.

Figure 5:
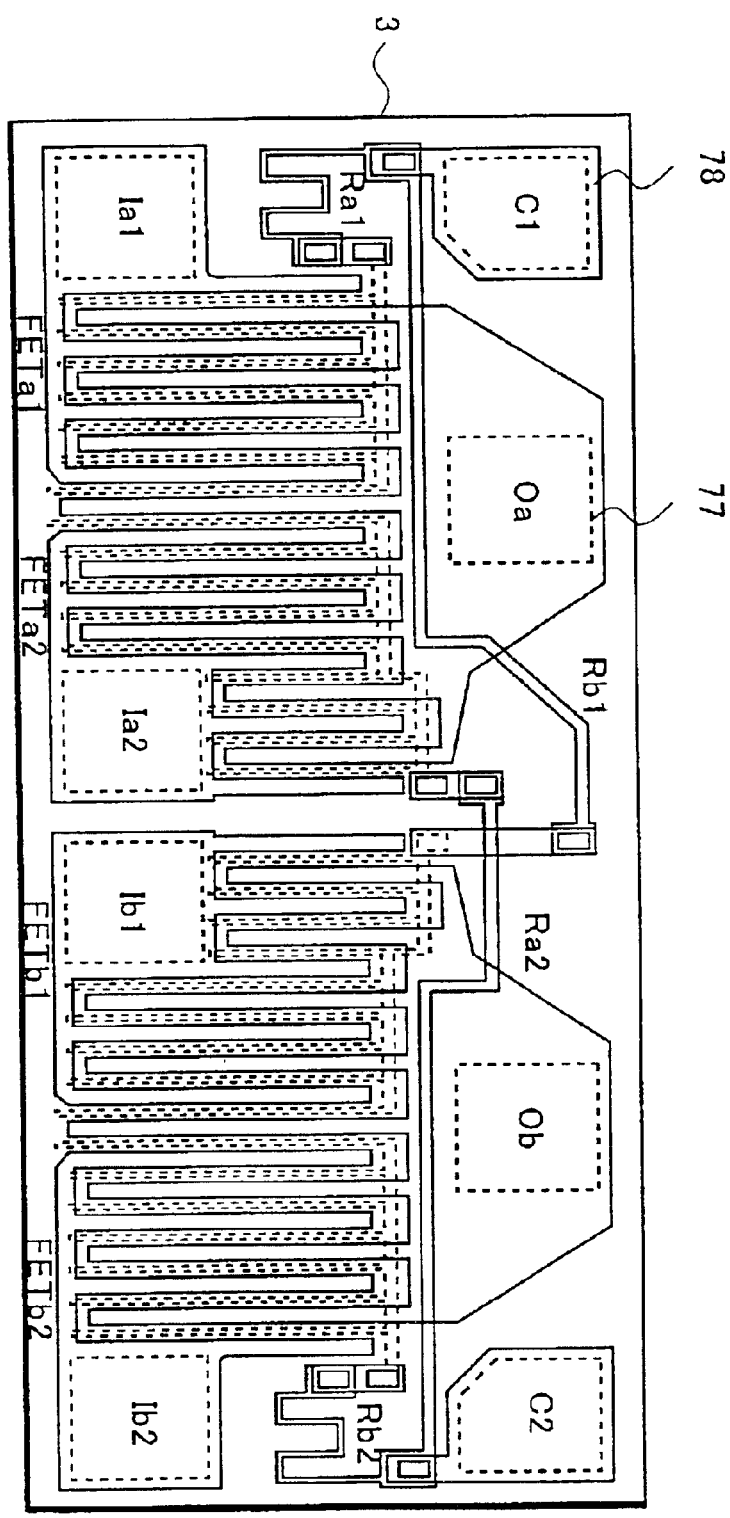
FIG. 5 is a plan view of a compound semiconductor chip having two FET switches of the first embodiment.

FIG. 5 is a plan view of the compound semiconductor chip used in the first embodiment. Two FET switches are formed on a GaAs substrate 3. The one on the top includes a pair of FETs, FETa1 and FETa2, and the one on the bottom includes another pair of FETs, FETb1 and FETb2. Each of the switches has two input electrode pads, Ia1 and Ia2 for the top switch, Ib1 and Ib2 for the bottom switch, an output electrode pad, Oa for the top switch and Ob for the bottom switch, and a control electrode pad, C1 for the top switch and C2 for the bottom switch. Each of the control electrode pads C1, C2 is shared by the two switches. Resistors Ra1, Rb1 Ra2, Rb2 are formed between corresponding gates of the FETs and the corresponding control electrode pads C1, C2 to prevent leakage of high frequency signals form the gate of the FETs. The incorporated copending U.S. patent application Ser. No. 10/016,143 describes the operation of this semiconductor device more in details.

Figure 6A:
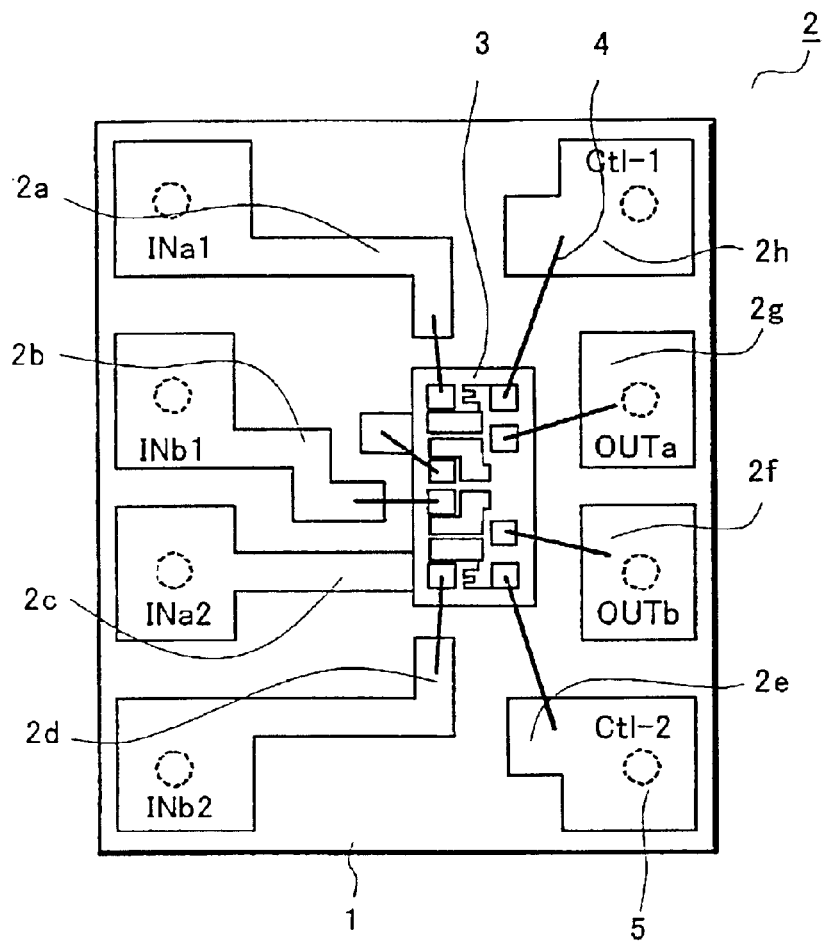
FIG. 6A is a plan view of the two-switch chip with four input electrode pads mounted on the substrate with four input terminals of the first embodiment.

FIG. 6A is a plan view of a packaging structure of the first embodiment in which the compound semiconductor chip 3 of FIG. 5 is mounted on the insulating substrate 1 of FIG. 4. The orientation of the chip 3 is the same as that of FIG. 5, i.e., the four input terminals are on the left side of the chip and the output and control terminals are on the right side of the chip. The chip is mounted on the lead 2c at the mounting area 11 of the lead pattern 2. The lead 2c extends from the input terminal INa2, comes in the area covered by the chip 3 on the left side of the chip 3, and comes out of the area covered by the chip 3 on the same side of the chip 3. The portion of this lead 2c coming out of the area is located on the opposite side of the portion of the lead 2c coming in the area with respect to the lead 2b extending from another input terminal INb1.

Figure 2:
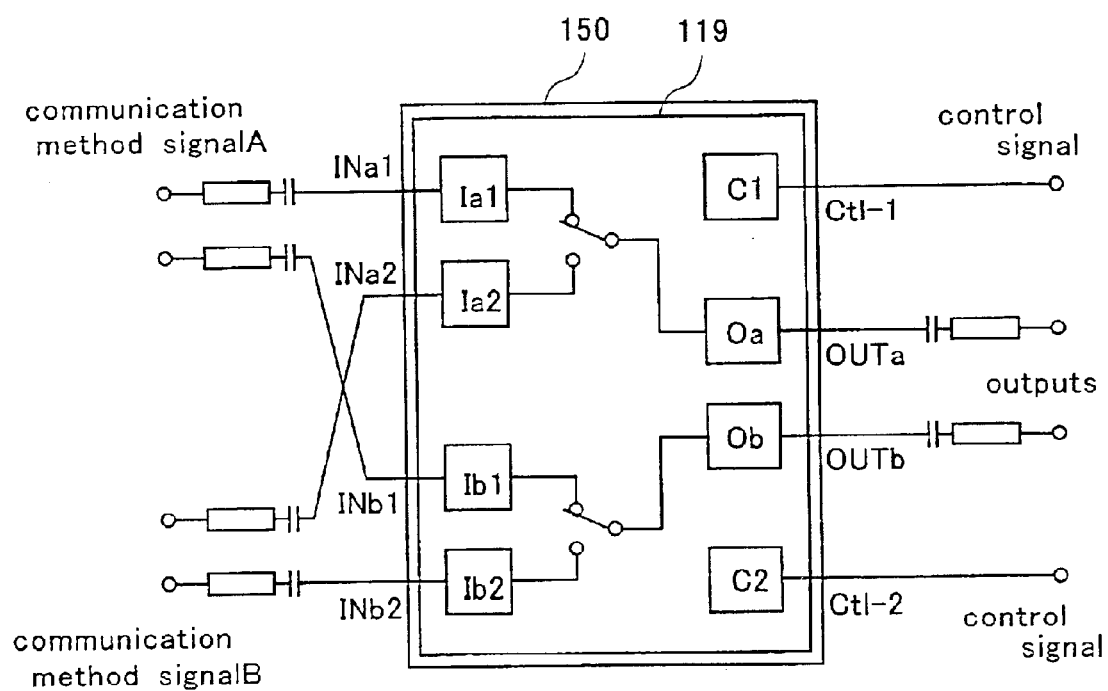
FIG. 2 is a schematic circuit diagram showing a connection of the four input terminals of the two-switch chip to an external signal source.
Figure 6B:
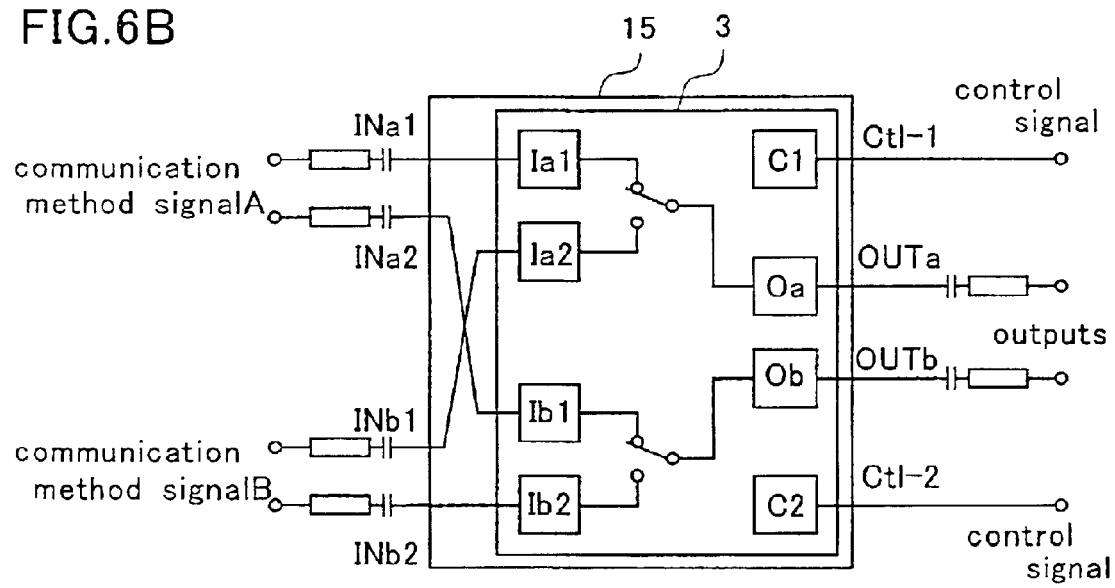
FIG. 6B is a schematic circuit diagram showing a connection of the four input terminals of the two-switch chip of FIG. 6A to an external signal source.

The leads are connected to the corresponding electrode pads on the chip by a bonding wire 4 using ball bonding or ultrasonic wave wedge bonding. On the right side of the insulating substrate 1, the leads 2g, 2f extending from the output terminals OUTa, OUTb are connected to the output electrode pads Oa, Ob, respectively. The leads 2h, 2e extending from the control terminals Ctl-1, Ctl-2 are connected to the control electrode pads C1, C2, respectively. On the left side of the insulating substrate 1, the leads 2a, 2d extending form the input terminals INa1, INb2 are connected to the input electrode pads Ia1, Ib2, respectively. Relative positioning of these six terminals are the same as the relative positioning of the six corresponding electrode pads. However, the lead 2c extending from the input terminal INa2 is connected to its corresponding electrode pad Ia2 at its end portion rather than its mid portion between the input terminal INa2 and the chip 3. The lead 2b extending form the input terminal INb1 is connected to the input electrode pad Ib1. This lead 2b is located between the end portion and the mid portion of the lead 2c. This configuration provides an intersection of wiring within the packaging, as shown in FIG. 6B. Accordingly, the relative positioning of the two input terminals INb1, INa2 in the middle is a reversal of the relative positioning of the corresponding input electrode pads Ia2, Ib1 on the chip 3. Thus, a use of this device does not have to provide an intersecting wiring outside the packaging such as the one shown in FIG. 2.

FIG. 6B is a schematic circuit diagram showing a connection of the four input terminals of the two-switch chip 3 of FIG. 6A to external signal sources A, B. One of the balanced signal of signal A needs to be fed to an input terminal of the first switch and another balanced signal of signal A needs to be fed to an input terminal of the second switch. Signal B also needs to be divided to the two switches. Because the order of the alignment of the four input electrode pads on the chip is different from the alignment of the outputs of the corresponding balanced signals, the two signal lines in the middle need to intersect each other in the circuit diagram. This is achieved by the configuration of the lead 2c extending from the input terminal INa2 with respect to the lead 2b extending from the input terminal INb1, as described above. Accordingly, the relative positioning of the input terminals are the same as the relative positioning of the corresponding outputs of the signal sources.

The lead pattern 2 is formed by a plating process based on thick film printing. Accordingly, the separations between the terminals and between the leads are as small as 75 μm. This contributes to reduction of overall packaging size.

Figure 7A:
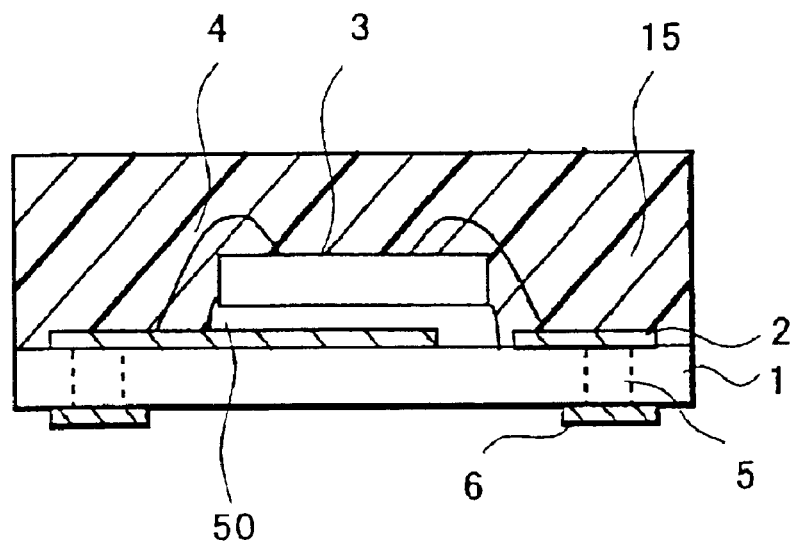
FIG. 7A is a cross-sectional view of the packaging structure of FIG. 6A.

FIG. 7A is a cross-sectional view of the packaging structure of FIG. 6A cut along the lead 2c. The compound semiconductor chip 3 is mounted on the lead of the lead pattern 2 with an insulating adhesive 5. A portion of the chip 3 is directly mounted on the substrate 1 with the adhesive 50. The electrode pads are connected to the corresponding leads of the lead pattern 2 by the bonding wire 4. Because the end portion of the lead is disposed close to the corresponding electrode pad on the chip 3, the length of the bonding wire 4 is short. The terminal, which is the far end of the lead pattern in this figure, is connected to an external electrode 6 that is formed underneath the terminal on the backside of the substrate 1 via a through hole 5. The through hole 5 penetrates the substrate 1 and is filled with a conductive material such as tungsten. A resin layer 15 covers the chip 3, the lead pattern 2 and the substrate 1. The top of the resin layer generally has a flat surface. The thickness of the resin layer 15 is about 0.3 mm. The thickness of the chip 3, which is sealed by the resin layer 15, is about 130 μm.

Figure 7B:
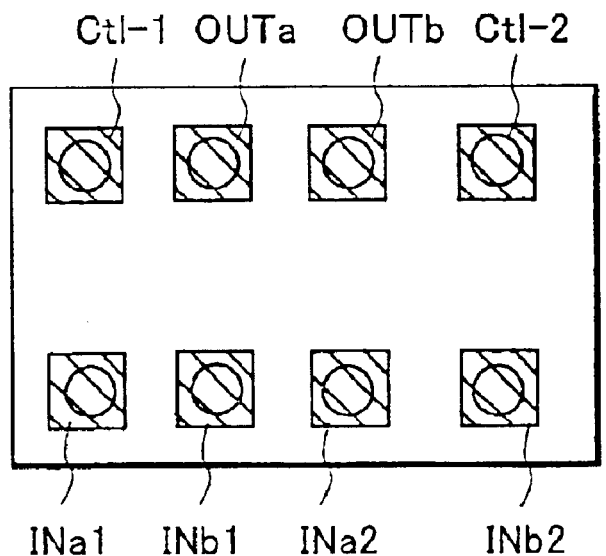
FIG. 7B is a plan view of the bottom face of the packaging structure of FIG. 6A.

FIG. 7B shows the backside of the packaging of FIG. 7A. Because the external electrodes 6 are formed just underneath the corresponding terminals, the positioning of the external electrodes on the backside of the packaging is exactly the same as the positioning of the terminals on the front side of the packaging, i.e., the front side of the substrate 1. Accordingly, the external electrodes 6, which make a direct contact with the corresponding signal lines of the external signal sources, have the same relative positioning as the relative positioning of the corresponding outputs of the signal sources. Because of the symmetrical configuration of the external electrodes 6, it may be difficult to identify each external electrode 6. For this reason, an identification marking for each external electrode 6 is formed on the top surface of the resin layer 15 at a corresponding location. Marking may be formed by indenting the top surface or printing the top surface.

Figure 8A:
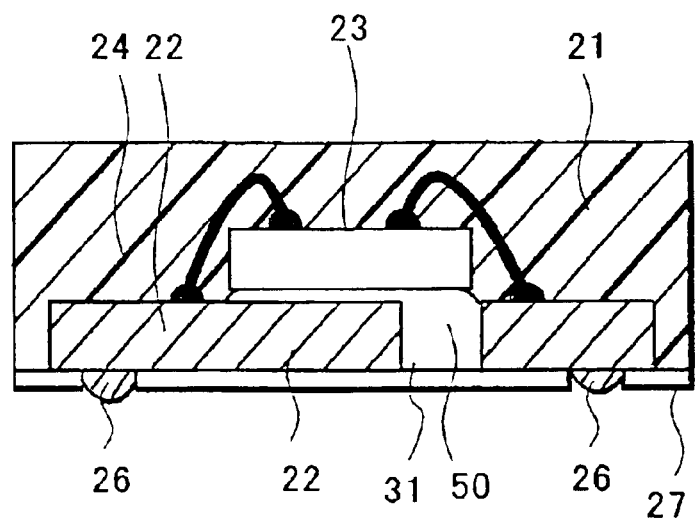
FIG. 8A is a cross-sectional view of a packaging of a second embodiment of this invention.

A semiconductor device with a packaging structure of a second embodiment of this invention is described with reference to FIGS. 8A–9B. FIG. 8A is a cross-sectional view of the semiconductor device of the second embodiment. The lead pattern of this embodiment is substantially the same as the lead pattern 2 of the first embodiment as shown in FIG. 3A. The packaging structure of this embodiment is similar to the packaging structure of the first embodiment shown in the plan view of FIG. 6A. All the terminals and the corresponding leads as well as the corresponding electrode pads on the chip are positioned and connected in the same manner as in the first embodiment. The chip 23 used in this embodiment is the same chip used in the first embodiment. As shown in FIG. 8, the difference between the two embodiments is that the lead pattern 22 including the terminals and the leads of the second embodiment is embedded in and supported by the resin layer 21. No other support is provided in the second embodiment for the lead pattern 22 of the device. On the other hand, the lead pattern 2 of the first embodiment is supported by the insulating substrate 1.

The resin layer 21 covers the lead pattern 22 and the chip 23, and fills the space 31 between portions of the lead pattern 22. The chip 23 is mounted on one of the leads (2c in FIG. 6A) with an insulating adhesive 50. The side wall of the lead pattern 22 is curved inwardly (not shown in the figure) for engaging with the resin layer 21 to strengthen the connection between the resin layer 23 and the lead pattern 22. A thermosetting resin, such as an epoxy resin, is used to form the resin layer 21 by transfer molding. Alternatively, a thermoplastic resin, such as a polyimide resin and a polyphenylene sulfide resin, is used to form the resin layer 21 by injection molding.

The thickness of the resin layer 21 is adjusted so that the separation between the top of the bonding wire 24 and the top surface of the resin layer 21 is about 50 µm. The thickness may vary depending on the mechanical strength required for the packaging. The packaging structure is annealed to flatten out the top surface of the resin layer 21. This annealing is required to suppress the bending of the packaging due to the difference in thermal expansion coefficients between the lead pattern 22 and the resin layer 21 as well as the difference in contraction rate after a re-flow process.

Figure 8B:
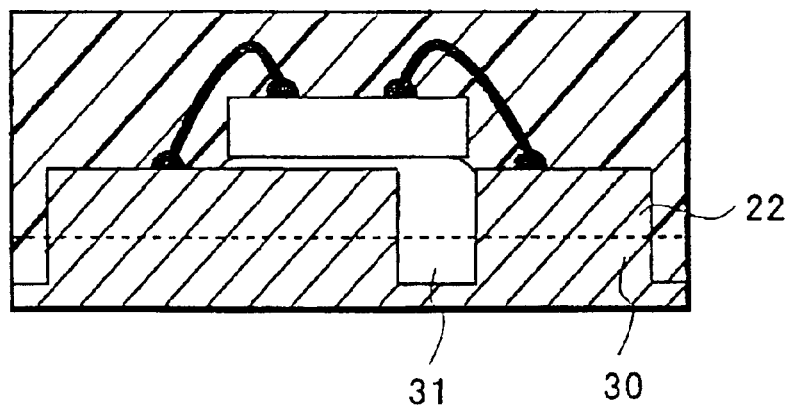
FIG. 8B is a device intermediate of the packaging of FIG. 8A.

FIG. 8B is a cross-sectional view of a device intermediate to form the device shown in FIG. 8A. The lead pattern 22 is formed by creating the space 31 in a conductive foil 30. At this point of manufacturing step, all the lead patterns are a part of the continuous conductive foil 30, as shown in FIG. 9B. Removing the backside of the conductive foil 30 separates the conductive foil 30 into individual lead patterns. The removing methods include grinding, polishing, etching and laser evaporation among other methods. As a result, the lead pattern 22 is exposed on the backside of the resin layer 21, and the back surface of the lead pattern 22 and the back surface of the resin layer 21 are at the same level.

A photoresist layer 27 covers the back side of the packaging and has openings to expose the backside of the terminals. Solder bumps are formed in the openings to work as external electrodes 26. These solder bumps are movable under surface tension during the mounting of the device on a circuit board so that the device and the board are aligned by itself. Since the external electrodes 26 are formed on the backside of the terminals, the positioning of the external electrodes 26 are exactly the same as the positioning of the terminals with respect to the plane of the packaging. Accordingly, the external electrodes 26, which make a direct contact with the corresponding signal lines of the external signal sources, have the same relative positioning as the relative positioning of the corresponding outputs of the signal sources.

Figure 9A:
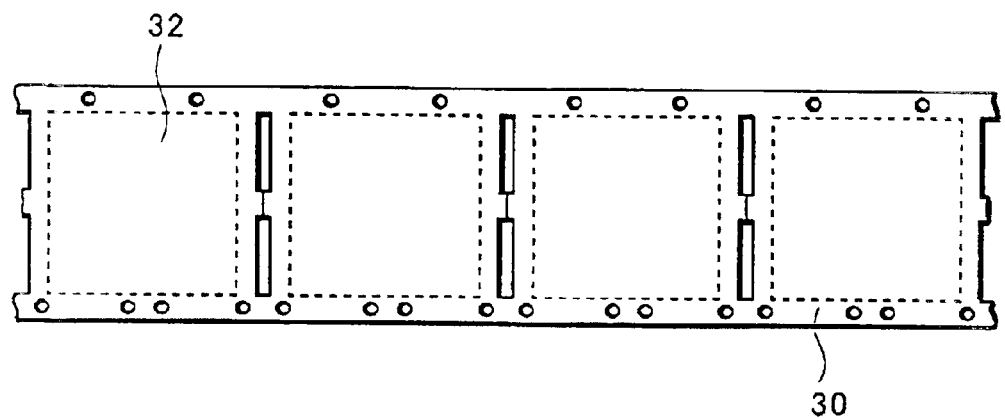
FIG. 9A is a plan view of a conductive foil for forming a lead pattern of the second embodiment.
Figure 9B:
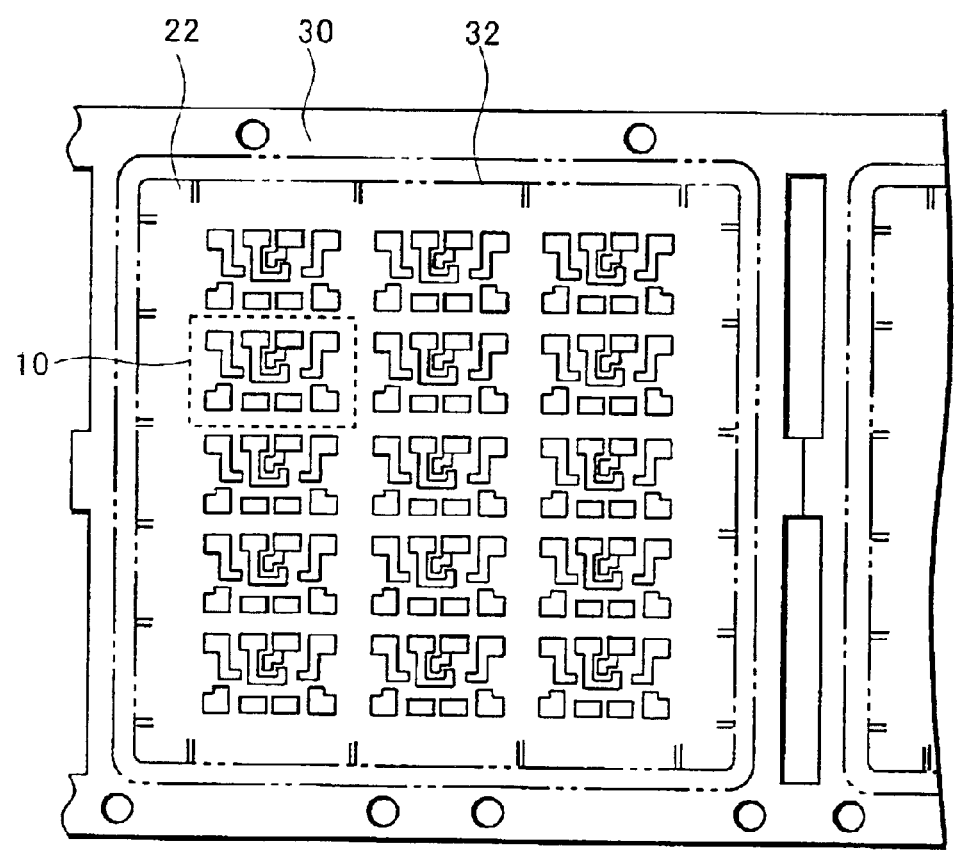
FIG. 9B is a plan view of one frame of the conductive foil of FIG. 9A with lead patterns.

FIG. 9A is a plan view of a conductive foil 30 used for forming the packaging structure of the second embodiment. The conductive foil 30 is made of copper, and its thickness before the removal of the backside is about 70 µm. The thickness may be anywhere between 10 and 300 µm, and can be outside this range provided that the depth of the space 31 is shorter than the thickness of the conductive foil 30. A plurality of frames 32 is formed in the conductive foil 30. The conductive foil 30 may be also made of aluminum or an iron-nickel alloy. If requirements for adhesion to the soldering materials, adhesion to the resin layer and plating of other metal are met, other metals can be used as the conductive foil 30.

FIG. 9B is an expanded plan view of one frame 32 of the conductive foil 30 of FIG. 9A. The frame 32 contains 15 package areas 10, one of which is indicated by the area encircled by the dotted line in the figure. In the package area 10, the island portions represent the portions of the conductive foil 30 that are not etched, and the other portions of the package area 10 represent the portions of the conductive foil 30 that are etched to form the space 31. The unetched portions provide the lead pattern 22 after the backside of the conductive foil 30 is removed. Because the lead pattern 22 is formed by etching, the separations between the terminals and between the leads can be as small as the spatial resolution of the etching method. This contributes to reduction of overall packaging size.

In the second embodiment, the conductive foil 30 support the chip 23 until the resin layer covers the chip 23 and the lead pattern 22. This removes the requirement of an additional support, i.e., the insulating substrate 1 of the first embodiment. Because of the absence of the rigid substrate, the flexible sheet like structure of the conductive foil 30 makes handling of the device intermediate easy and simple during the manufacturing.

Figure 10:
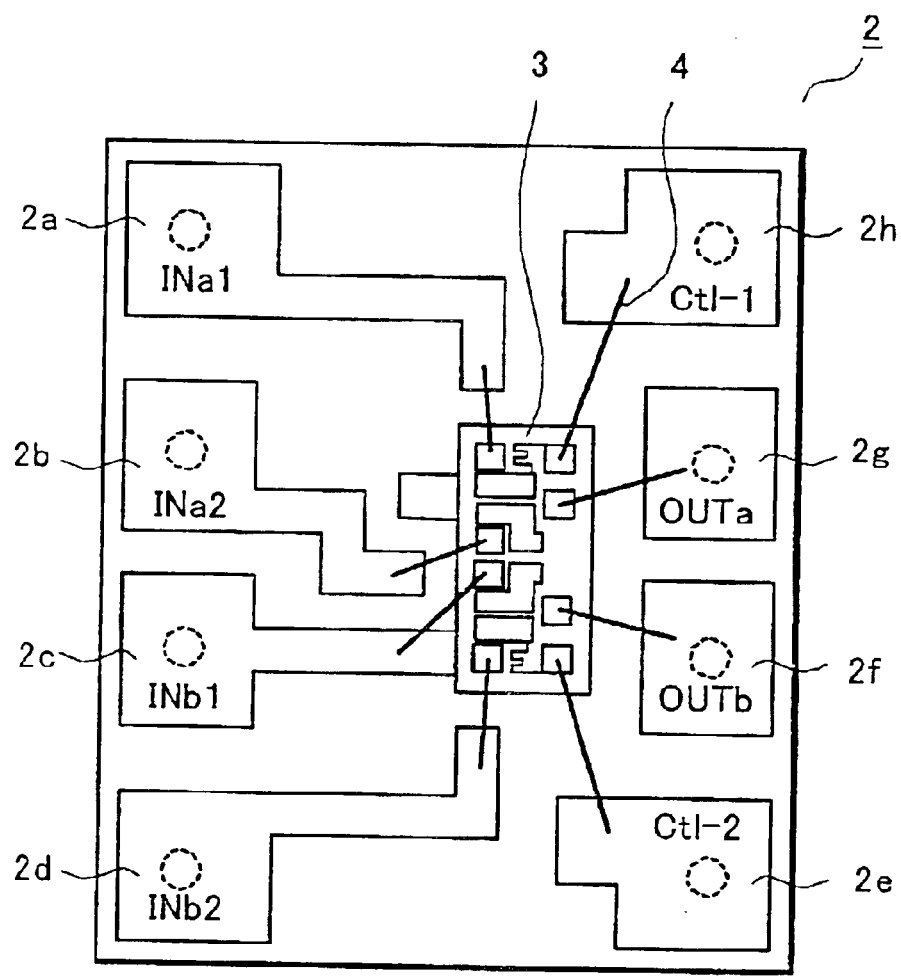
FIG. 10 is a plan view of the packaging of the first embodiment with an alternative connection scheme.

FIG. 10 is a plan view of the packaging of the first embodiment with an alternative connection scheme. The configuration of the terminals, the leads and the electrode pads on the chip is identical to the configuration of FIG. 6A. The difference is the connection between the two leads 2b, 2c in the middle of the terminal array on the left side of the substrate 1 and the two input electrode pads in the middle of the pad array on the left side of the chip 3. In this connection scheme, the lead 2b is connected to the input electrode pad Ia2, and the lead 2c is connected to the input electrode pad Ib1 at the mid portion of the lead 2c between the terminal and the chip 3, rather than its end portion. Accordingly, this connection is the same as the connection of FIG. 1. In other words, the intersecting wiring of FIG. 6A is not formed within the packaging structure. There are other applications of this semiconductor device in which intersecting wiring is not required. The device of the first embodiment can be easily modified for use in such applications by changing the bonding wire connections between the two sets of the lead and the electrode pad without any changes in the chip design or the lead pattern. By changing the wiring connection, the terminal connected to the lead 2b can be a terminal representing the input electrode pad Ia2 or a terminal representing the input electrode pad Ib1. The terminal connected to the lead 2c can also represent the input electrode pad Ia2 or the input electrode pad Ib1. This alternative connection scheme is also applied to the second embodiment.

Figure 11:
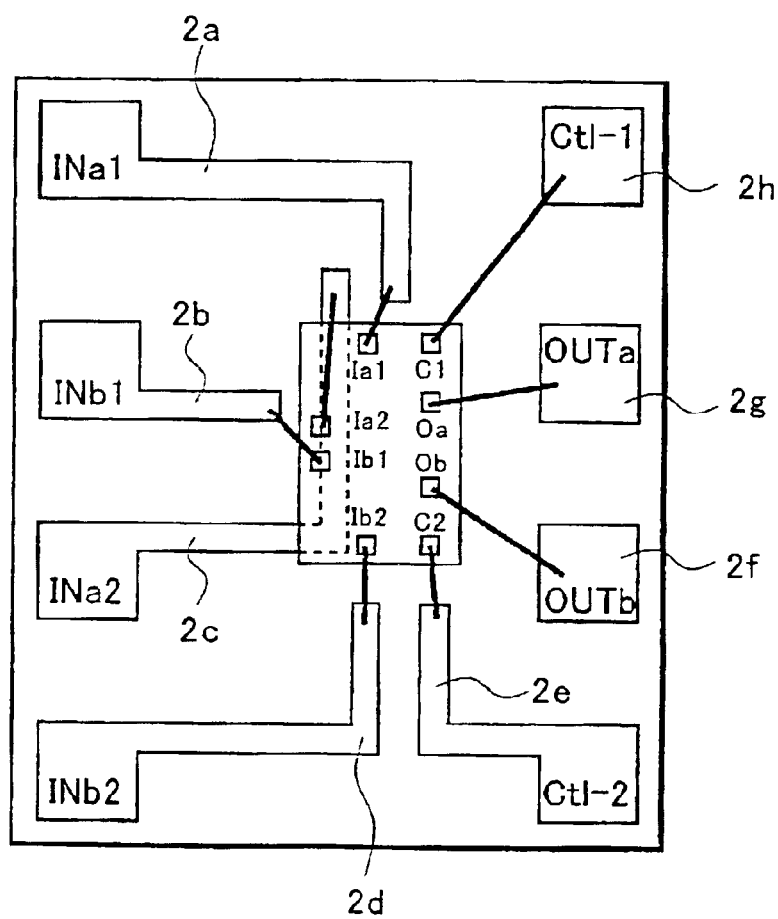
FIG. 11 is a plan view of the packaging of the first embodiment with an alternative lead configuration.

FIG. 11 is a plan view of the packaging of the first embodiment with an alternative lead configuration. This lead configuration is the same as the lead configuration of FIG. 3A except the shape of the lead 2c that is used for mounting the chip 11. The lead 2c comes in the mounting area 11 at the left side of the mounting area 11, runs through the mounting area 11, and comes out of the mounting area 11 on the top side of the mounting area 11. Although the two alternative wire bonding points of this lead 2c, the end portion and the mid portion, are not located on the same side of the mounting area 11, as in the case of the configuration of FIG. 3A, the two terminals in the middle 2b, 2c can be connected to either of the two switches according to the application of the device. This alternative connection scheme is also applied to the second embodiment. It should noted that in the embodiments described above the boding wires are configured not to intersect each other.

In the first and second embodiments, a switching device made of a compound semiconductor is mounted on the lead pattern. However, other semiconductor chips, including other integrated circuits, transistors and diodes that are made of silicon or compound semiconductor, can be mounted on the lead pattern in the packaging. Furthermore, passive elements, including chip capacitors, chip resistors and chip inductors, can be also mounted. Elements that are mounted with the top surface facing the lead pattern can be also mounted in this packaging structure. In other words, any surface mounting element can be used in the packaging of this invention.

The above is a detailed description of particular embodiments of the invention which is not intended to limit the invention to the embodiments described. It is recognized that modifications within the scope of the invention will occur to a person skilled in the art. Such modifications and equivalents of the invention are intended for inclusion within the scope of this invention.

What is claimed is:

1. An insulating substrate for mounting a surface mounting element thereon, the substrate comprising:
    a first terminal disposed on the substrate;
    a first lead disposed on the substrate and extending from the first terminal;
    a second terminal disposed on the substrate;
    a second lead disposed on the substrate and extending from the second terminal; and
    an element mounting area for mounting the surface mounting element thereon, wherein
    the first and second terminals are disposed on a same side of the substrate with respect to the element mounting area, and
    the first lead comes in and comes out of the element mounting area so that a portion of the first lead coming out of the element mounting area is located on an opposite side of portion of the first lead coming in the element mounting area with respect to the second lead.

2. The insolating substrate of claim 1, wherein the first lead comes in and comes out of the element mounting area on a same side of the element mounting area.

3. A packaging of a surface mounting element, comprising an insulating substrate;
    first terminal disposed on the substrate;
    a first lead disposed on the substrate and extending from the first terminal, the surface mounting element being mounted on a portion of the first lead;
    a second terminal disposed an the substrate; and
    a second lead disposed on the substrate and extending from the second terminal, wherein
    the first and second terminals are disposed on a same side of the substrate with respect to the surface mounting element, and
    the first lead comes in and comes out of an area covered by the surface mounting element so that a portion of the first lead coming out of the area is located on an opposite side of a portion of the first lead coming in the area with respect to the second lead.

4. The packaging of claim 3, wherein the first lead comes in and comes out of the area covered by die surface mounting element on a same side of the surface mounting element.

5. The packaging of a surface mounting element of claim 3, wherein an electrode pad on the surface mounting element that corresponds to the first terminal is connected to the portion of the first lead coming out of the area or the portion of the first lead coming in the area so that an output portion of a device external to the packaging that is connected to the first terminal is positioned closer to the first terminal than other output portions of the external device.

6. The packing of a surface mounting element of claim 5, wherein the first terminal and the electrode pad on the surface mounting element is connected by a bonding wire.

7. A conducting lead pattern for mounting a surface mounting element thereon, the lead pattern comprising:
    a first terminal portion;
    a first lead portion extending from the first terminal portion;
    a second terminal portion;
    a second lead portion extending from the second terminal portion; and
    an element mounting portion for mounting the surface mounting element thereon, the element mounting portion being a part of the first lead portion, wherein
    the first and second terminal potions are disposed on a same side of the substrate with respect to the element mounting portion; and
    a part of the first lead portion connected to the element mounting portion at one end of the element mounting portion is located on an opposite side of another part of the first lead portion connected to the element mounting portion at another end of the element mounting portion with respect to the second lead portion.

8. The conducting lead pattern of claim 7, wherein said a part of the first lead portion and said another part of the first lead portion are disposed on a same side with respect to the element mounting portion.

9. A semiconductor device comprising:

an insulating substrate;

a plurality of terminals disposed on the substrate;

a plurality of leads disposed on the substrate and extending from the corresponding terminal; and a semiconductor chip having a plurality of electrode pads disposed on a surface thereon and being mounted on one of the leads, wherein the lead having the semiconductor chip thereon bends in a plane of the substrate so that an end portion and a mid portion of the lead having the semiconductor chip thereon are outside an area covered by the semiconductor chip, and one of the electrode pads of the semiconductor chip is connected to the and portion of the lead having the semiconductor chip thereon by a bonding wire.

10. The semiconductor device of claim 9, wherein the end portion and the mid portion are disposed on a same side of the semiconductor chip.

11. The semiconductor device of claim 9, wherein the end portion of the lead having the semiconductor chip thereon is on opposite side of the mid portion of the lead having the semiconductor chip thereon with respect to one of the leads that do not have the semiconductor chip thereon.

12. The semiconductor device of claim 9, wherein the semiconductor chip comprises a compound semiconductor chip having a bottom portion that is semi-insolating and faces the lead having the compound semiconductor chip thereon.

13. The semiconductor device of claim 9, wherein the semiconductor chip comprises a switching device that has two switching circuits.

14. A semiconductor device comprising:

an insulating substrate;

four input terminal disposed on the substrate and aligning along one edge of the substrate;

four leads disposed on the substrate, each of the loads extending from one of the input terminals; and a semiconductor chip having a first circuit and a second circuit and being mounted on one of the leads, each of the first and second circuit having two input electrode pads, wherein the lead having the semiconductor chip thereon bends in a plane of the substrate so that an end portion and a mid portion of the lead having the semiconductor chip thereon are outside an area covered by the semiconductor chip.

one of the input electrode pads of the first circuit is connected to the end portion of the lead having the semiconductor chip thereon by a bonding wire, and the end portion of the lead having the semiconductor chip thereon is on an opposite side of the mid portion of the lead having the semiconductor chip thereon with respect to one of the leads that is connected to one of the input electrode pads of the second by a bonding wire.

15. The semiconductor device of claim 14, wherein the end portion and the mid portion are disposed on a same side of the semiconductor chip.

16. The semiconductor device of claim 14, further comprising four external electrodes that are disposed on a backside of the substrate, each of the external electrodes being connected to one of the four input terminals via through hole, the backside of the substrate not having the input terminals and the corresponding leads thereon.

\* \* \* \* \*